United States Patent [19]

Rischmüller

[11] 4,404,478
[45] Sep. 13, 1983

[54] PROCESS FOR CONTROLLING A DARLINGTON CIRCUIT AND A LOW-LOSS DARLINGTON CIRCUIT

[75] Inventor: Klaus Rischmüller, Paris, France

[73] Assignee: Thomson-CSF, Paris, France

[21] Appl. No.: 208,062

[22] Filed: Nov. 18, 1980

[30] Foreign Application Priority Data

Nov. 23, 1979 [FR] France .................. 79 28979

[51] Int. Cl.³ .............. H03K 3/26; H03K 17/60; H03K 23/22
[52] U.S. Cl. ....................... 307/315; 307/254; 307/300; 307/310; 307/359
[58] Field of Search ............ 307/315, 359, 254, 300, 307/491, 494, 280, 310; 323/279; 330/298

[56] References Cited

U.S. PATENT DOCUMENTS

| 3,867,650 | 2/1975 | Baldwin | 307/359 |
| 3,889,137 | 6/1975 | Kay | 307/300 |
| 3,961,206 | 6/1976 | Lau | 307/315 |
| 4,028,561 | 6/1977 | Black | 307/300 |
| 4,060,758 | 11/1977 | Wright | 307/315 |
| 4,318,011 | 3/1982 | Zeis | 307/359 |

OTHER PUBLICATIONS

*IBM Technical Disclosure Bulletin*, vol. 15, No. 12, May 1973, New York (US) S.K. Wiedman: "Saturation Controlled Transistors", p. 3798.
*Electronics*, vol. 38, No. 16, Aug. 9, 1965, New York Cianciola: "Improving Darlington Speed", p. 83.

Primary Examiner—Stanley D. Miller
Assistant Examiner—B. P. Davis
Attorney, Agent, or Firm—Roland Plottel

[57] ABSTRACT

A process for using a Darlington circuit comprising a main transistor and a pilot transistor wherein the collector voltage of the main transistor is compared with its base voltage. The resulting signal is transmitted to a switch feeding a control current to the base of the pilot transistor or the base of the main transistor. Thus, the circuit operates as a Darlington circuit or else the main transistor operates independently according to the level of the collector current.

4 Claims, 6 Drawing Figures

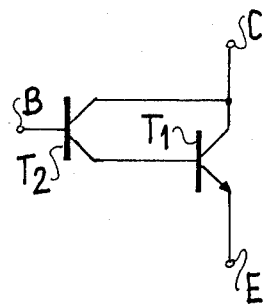
FIG_1
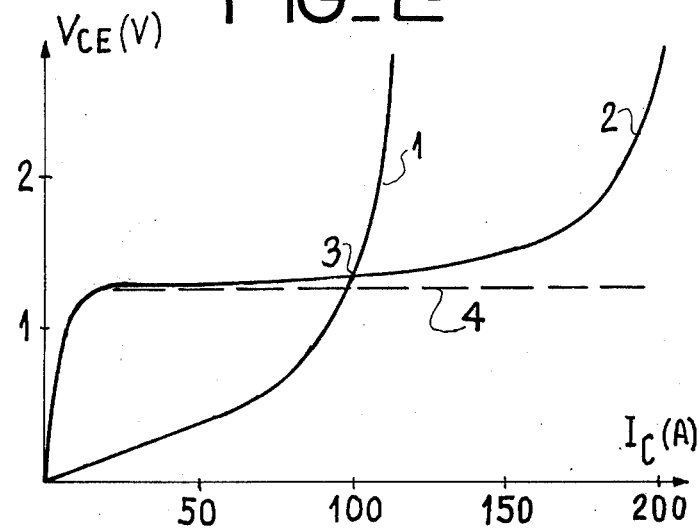
FIG_2
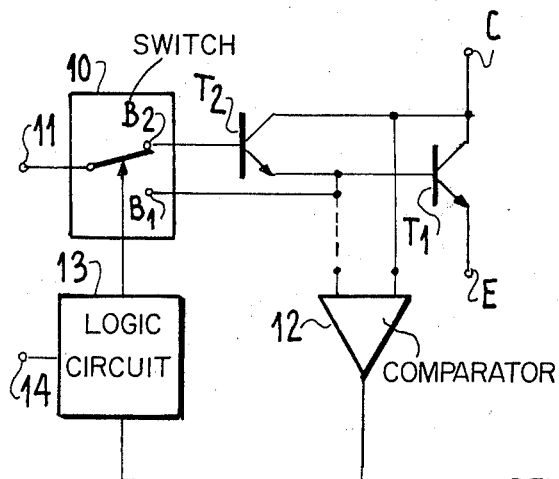
FIG_3
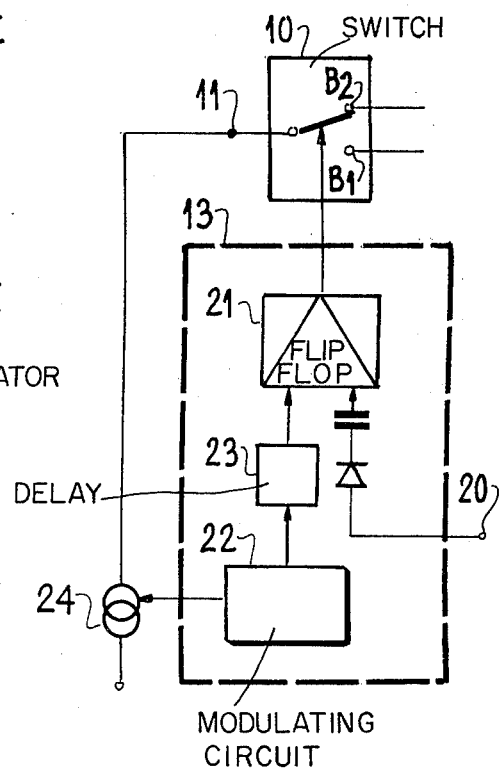
FIG_4

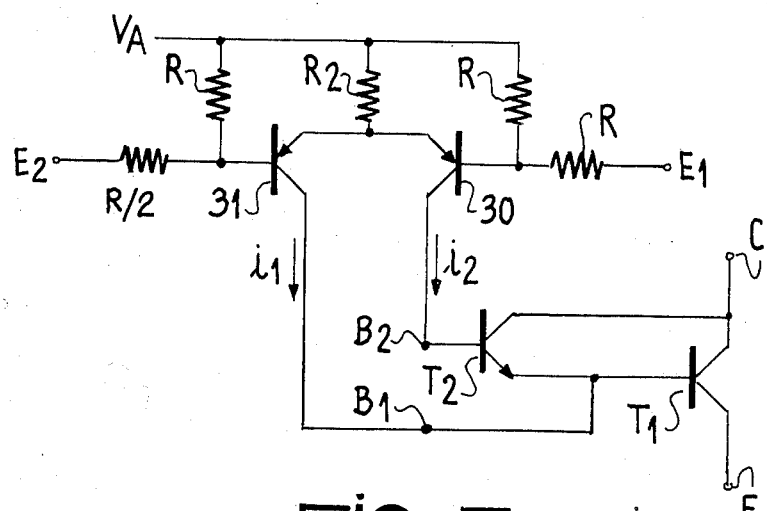
FIG_5
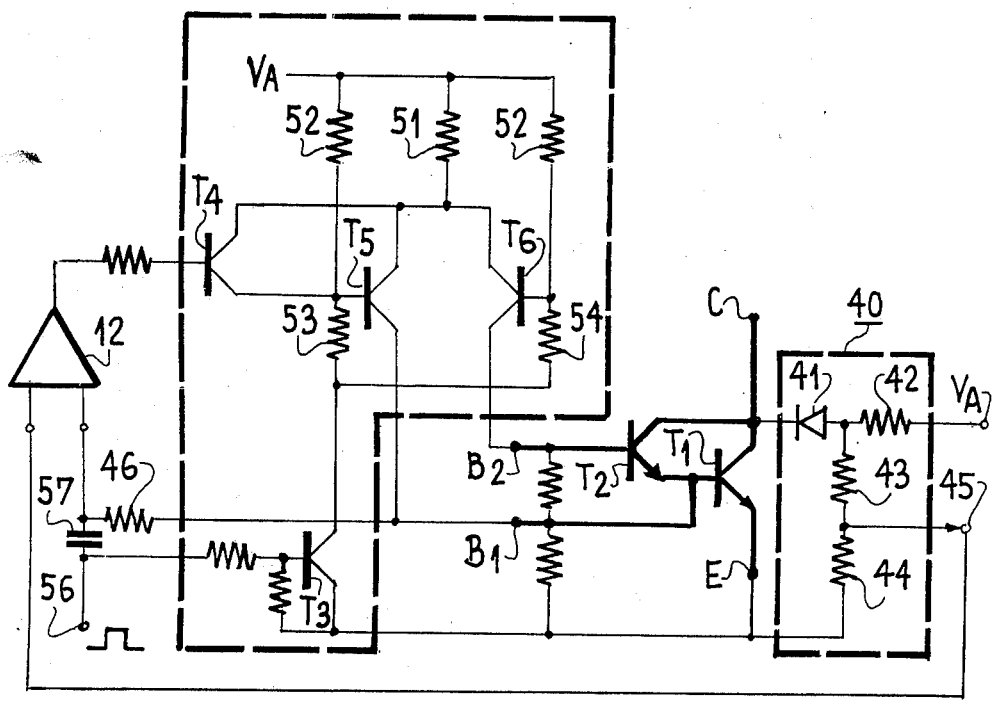
FIG_6

PROCESS FOR CONTROLLING A DARLINGTON CIRCUIT AND A LOW-LOSS DARLINGTON CIRCUIT

BACKGROUND OF THE INVENTION

The present invention relates to a low-loss Darlington-type transistor circuit and more particularly to such a circuit in which the power transistor may operate alternately as an independent transistor or in a Darlington circuit.

FIG. 1 recalls the structure of a two-transistor Darlington circuit. This circuit comprises a power transistor or main transistor $T_1$ and an auxiliary transistor or pilot transistor $T_2$. The collectors of these two transistors are interconnected and the base of the main transistor is connected to the emitter of the pilot transistor. This assembly comprises three connection terminals, a collector terminal C corresponding to the collector terminal $C_1$ of the main transistor, an emitter terminal E corresponding to the emitter terminal $E_1$ of the main transistor and a control terminal B corresponding to the base $B_2$ of the pilot transistor. Generally, there will be designated hereinafter without an index number the terminals corresponding to the circuit as a whole, with the index number 1 the terminals corresponding to the main transistor $T_1$ and with the index number 2 the terminals corresponding to the pilot transistor $T_2$. A Darlington circuit such as shown in FIG. 1 may be constructed in the form of an integrated structure on a semiconductor substrate or in the form of an association of discrete components. In all cases, the main transistor $T_1$ is a transistor of high power compared with transistor $T_2$.

The advantages of a Darlington circuit are well-known and reside essentially in the fact that with this circuit the main transistor $T_1$ can be made to conduct in the saturated state with a much lower base current than would be necesary in the absence of transistor $T_2$.

Within the scope of the invention, a disadvantage of the Darlington circuit will be more particularly examined namely, for a current range which transistor $T_2$ could withstand alone, the forward voltage drop is higher in the case of the Darlington circuit than in the case where this transistor $T_1$ is mounted alone.

We will be concerned here essentially with the cases of power transistors operating as switches, i.e. in which the base current is sufficiently high for always operating under conditions of real saturation.

Thus, if we consider a transistor such as transistor $T_1$ mounted independently in which it is desired to obtain a collector current $I_{C1}$ of 50 A, so as to have a condition of real saturation the base current will have to be about 2.5 amps when the forward voltage drop between the collector and the emitter will be substantially $V_{CE\ sat} = 0.4$ volts. If we now wish transistor $T_1$ associated in the Darlington circuit with transistor $T_2$ to operate under the same conditions, i.e., with a collector current of about 50 amps, the base current will only have to be 0.5 A but the forward voltage drop will be greater than 1 volt. The reduction of the base current in this range of values is not an appreciable advantage whereas the increase in the forward voltage drop forms a decided disadvantage. In fact, it corresponds to consumption in the transistor, i.e. heat losses. On the other hand, if it were desired to operate transistor $T_1$ with a very high collector current of the order of 150 A, this would be impossible because of the very rapid increase of the forward voltage drop in this transistor and, furthermore, even if it were possible, would require the provision of a very high base current, for example of the order of 30 amps. On the other hand, with a Darlington circuit, for a collector current of 150 A, saturation operation could be provided with a reasonable base current of the order of 2 A and the forward voltage drop would be less than 1.8 volts.

FIG. 2 shows forward voltage drop characteristics ($V_{CE}$) as a function of the collector current ($I_C$) for an independent transistor (curve 1) and for the association in a Darlington circuit of the same transistor with a pilot transistor (curve 2). The base currents are not shown but are assumed to be such that the power transistor always operates in a state of true saturation. On the coordinate axes of FIG. 2 have been shown numerical values to help with understanding but these numerical values are not to be interpreted as giving a limiting indication on the scope of the invention. Curves 1 and 2 intersect at a point of intersection 3. For values of the collector current greater than the value corresponding to point 3 (100 A in the example chosen), it is clear that only operation in a Darlington circuit is possible and it is for this reason that Darlington-type circuits are usually used. For collector currents less than those corresponding to point 3, the curves of FIG. 2 show clearly that the consumption or forward voltage drop of the independently-mounted transistor is distinctly less than that of the same transistor in a Darlington circuit. Furthermore, for this range of values, the base currents required for placing an independent transistor in true saturation operation remain reasonable. Thus, it is a feature of the present invention to have clearly brought out this phenomenon illustrated in FIG. 2, i.e. that it is advantageous, insofar as the forward voltage drop is concerned, to have operation as an independent transistor for a first range of values of the collector current then Darlington operation for higher values of this collector current.

SUMMARY OF THE INVENTION

To resolve this problem, the present invention provides for detecting the collector current of a Darlington circuit, comparing this collector current with a threshold value, and causing the power transistor to operate independently when the value of the collector current is less than the predetermined threshold.

The detection of the collector current is preferably not carried out directly but rather by detection of a corresponding variable such as the collector/emitter voltage of the main transistor.

More particularly, the present invention provides a Darlington-type transistor circuit in which the base terminal of the main transistor is accessible, this circuit comprising furthermore a switching means adapted to receive at its input terminal a control current and transmitting this current to one or the othr of its output terminals connected respectively to each of the bases of the transistors of the Darlington circuit; a means for detecting and comparing the current flowing through the power transistor; and control means for actuating the switching means towards the first or second base according as to whether the detection means indicates that the current in the power transistor is greater or lesser than a predetermined threshold. The detection and comparison means detect the collector voltage of the power transistor and compare it with a fixed predetermined voltage. Instead of carrying out the comparison with respect to a fixed predetermined voltage, the collector voltage of the power transistor may be compared with its base voltage, the result of this comparison being itself compared with a threshold value.

Other approaches could be considered for making the operation of the main transistor of the Darlington circuit independent of the pilot transistor. For example, a switch, such as a transistor, could be placed in series between the collector terminals of the pilot transistor and of the power transistor. It would then be advisable to open this series transistor when the current in the main transistor becomes less than a predetermined threshold. Nevertheless, if this solution seems possible in the case of discrete components, it does not seem feasible in the case of an integrated Darlington circuit in which the collector terminal of the pilot transistor is not accessible independently of the collector terminal of the main transistor. Furthermore, in the case where the circuit is possible, i.e. made from discrete components, the additional transistor inserted in series with the collector terminal of the pilot transistor creates an increased voltage drop between the collector and emitter terminals of the circuit when this latter is in Darlington operation.

Another approach to solving the problem posed would consist in using, on the one hand, a Darlington circuit and, on the other hand an independent transistor equivalent to the main transistor of the Darlington circuit and in alternately controlling the Darlington circuit and the independent transistor depending on the collector current. The obvious disadvantage of this method is to compel duplication of the number of power components.

DESCRIPTION OF THE DRAWINGS

These different objects, features and advantages as well as others of the present invention will be discussed in detail in the following description of particular embodiments made with reference to the accompanying figures in which:

FIG. 1 shows a conventional Darlington circuit;

FIG. 2 shows characteristic curves of the forward voltage drop ($V_{CE}$) as a function of the collector current ($I_C$) for a Darlington circuit and for an independent transistor;

FIG. 3 shows a circuit in accordance with the present invention;

FIG. 4 shows in greater detail a logic portion of the circuit of FIG. 3;

FIG. 5 shows a base current switching control circuit usable in relation with the embodiment of FIG. 3; and FIG. 6 shows a particular embodiment of the present invention forming a variation of the circuits of FIGS. 3, 4 and 5.

DESCRIPTION OF THE PREFERRED EMBODIMENTS

FIG. 3 shows one embodiment of the present invention. There can be seen the two transistors $T_1$ and $T_2$ in a Darlington circuit as well as the collector and emitter terminals C and E of the circuit which correspond to terminals $C_1$ and $E_1$ of transistor $T_1$. The control terminal B of the Darlington circuit is now designated by the reference $B_2$ so as to distinguish it from the base terminal $B_1$ of transistor $T_1$ which is made accessible in accordance with the present invention. These terminals $B_1$ and $B_2$ form the two possible output terminals of a switch 10 receiving at its input terminal 11 a base control current. As was mentioned above, switch 10 establishes the connection between its input terminal 11 and its output terminal $B_2$ when the current flowing through transistor $T_1$ is greater than the current corresponding to point 3 of FIG. 2 and between its input terminal 11 and its output terminal $B_1$ when the collector current is less than this value. This detection of the collector current may be accomplished in any possible way. One of these ways consists in transmitting the collector voltage to a first input of a comparator 12 whose second input receives a reference voltage. According as to whether the voltage on the collector is greater or less than the predetermined reference voltage, a signal is fed to a logic circuit 13 comprising possibly other inhibiting and resetting inputs 14 for controlling the switching of switch 10.

According to a variation of the present invention, illustrated by broken lines in FIG. 3, the second input of comparator 12 may be connected to terminal $B_1$. The voltage at this terminal $B_1$ when the circuit is conducting is shown by the broken-line curve 4 of FIG. 2. It can be seen that, as soon as the collector current of the power transistor T is close to the value corresponding to that of point 3, the collector/emitter voltage of transistor $T_1$ is very close to its base/emitter voltage, i.e. that the voltage $V_{CE}$ is substantially equal to voltage $V_{BE1}$. As soon as this condition is detected by comparator 12, this latter sends appropriate enabling signals to logic circuit 13. This variation does away with the need to provide a reference voltage at the second input terminal of comparator 12 and also avoids providing a specific circuit for each particular transistor $T_1$ associated with a particular transistor $T_2$.

FIG. 4 shows one embodiment of the logic circuit 13 of FIG. 3. This logic circuit comprises an input terminal 20 receiving the output of amplifier 12 and transmitting it to a first input of a flip-flop 21, for example a set input of this flip-flop. The other input or reset input of flip-flop 21 is connected to a pulse-width modulating circuit 22 through a delay circuit 23. The pulse-width modulating circuit 22 also controls the switching of a current source 24 supplying the input terminal 11 of switch 10 described previously in connection with FIG. 3. This resetting allows the switch to be placed again in the rest state in position $B_2$ (terminal B of the Darlington circuit).

FIG. 5 shows a particular embodiment of switch 10. We find again in FIG. 5 transistors $T_1$ and $T_2$ and the terminals $B_1$, $B_2$, C and E of the Darlington circuit of the invention. Terminal $B_2$ is connected to a supply source $V_A$ through the collector/emitter junction of a transistor 30 and a resistor $R_2$. Terminal $B_1$ is connected to this same supply source through the collector/emitter junction of a transistor 31 and the same resistor $R_2$. Complementary voltages $E_1$ and $E_2$ are supplied to the base terminals of the respective transistors 30 and 31. Thus, when voltage $E_1$ is at the low level and voltage $E_2$ at the high level, a current $I_2$ flows towards base $B_2$ and the circuit operates as a Darlington circuit. On the other hand, in the opposite condition, a current $I_1$ flows towards base $B_1$ and transistor $T_1$ operates in an independent circuit. It will be noted that an advantage of this particular arrangement resides in the fact that it allows if required currents $I_1$ and $I_2$ to be adjusted simply to definite and predetermined values by providing an intermediate circuit between one or other of the terminals $B_1$ and $B_2$ and the voltage $V_A$.

The present invention finds particularly applications as choppers for controlling motors. For such circuits, there is often used as main "switch" for the chopper, a transistor in a Darlington circuit. In fact, this Darlington circuit is useful solely because, at start-up, a high-current drain is felt. As soon as the motor reaches stable operation, the current required is much smaller and operation as an independent power transistor such as outlined above is preferable. The advantage of this switching from the Darlington-type circuit to the independent transistor-type circuit is particularly advantageous in this specific application because the starring-up period is generally short compared with the period of stable operation. The saving in energy is then considerable. This allows in particular economy to be achieved in the mounting of the power transistor whose cooling means may be considerably reduced.

The present invention is not limited to the embodiments which have been more explicitly described above; it includes the different variations and generalizations thereof included within the scope of the claims hereafter.

What is claimd is:

1. A process for controlling a Darlington circuit comprising a power transistor and a pilot transistor, comprising the following steps:
   detecting the collector current in the power transistor,
   comparing the detected value with a predetermined threshold value, and
   causing the power transistor to operate independently of the pilot transistor when the collector current is less than a predetermined threshold.

2. In a Darlington-type transistor circuit comprising a power transistor and a pilot transistor, the collectors of the two transistors being interconnected and the base of the power transistor being connected to the emitter of the pilot transistor, the collector and the emitter of the power transistor forming the main terminals of the circuit and the base of the pilot transistor forming a control terminal, the improvement is that it further comprises:
   second control terminal connected to the base of the power transistor,
   a switching means adapted to receive at its input terminal a control current and selectively transmitting this current to its output terminals connected respectively to each of the control terminals,
   a means for detecting and comparing the current flowing through the power transistor,
   control means for selectively actuating the switching means towards the control terminal according to whether the detection means indicates that the current in the power transistor is greater or less than a predetermined threshold.

3. The circuit as claimed in claim 2, wherein the detection and comparison means detects the collector voltage of the power transistor and compares it with a predetermined fixed voltage.

4. The circuit as claimed in claim 2, wherein the detection and comparison means detects the collector voltage of the power transistor and compares it with the base voltage of this power transistor accessible at the level of the second control terminal, the result of this comparison being itself compared with a threshold value and transmitted to the control means.

* * * * *